(12) United States Patent
Garces

(10) Patent No.: US 12,119,726 B2
(45) Date of Patent: Oct. 15, 2024

(54) ELECTRIC GENERATOR

(71) Applicant: Miguel Garces, Miami, FL (US)

(72) Inventor: Miguel Garces, Miami, FL (US)

(*) Notice: Subject to any disclaimer, the term of this patent is extended or adjusted under 35 U.S.C. 154(b) by 261 days.

(21) Appl. No.: 17/828,805

(22) Filed: May 31, 2022

(65) Prior Publication Data

US 2023/0387774 A1 Nov. 30, 2023

(51) Int. Cl.
*H02N 1/04* (2006.01)
*H02K 44/08* (2006.01)
*H02K 44/12* (2006.01)
*H02N 1/00* (2006.01)

(52) U.S. Cl.
CPC .......... *H02K 44/085* (2013.01); *H02K 44/12* (2013.01)

(58) Field of Classification Search
CPC . H02N 3/00; H02N 11/00; H02N 1/04; H02N 1/00; H02K 44/08; H01G 5/0132; H01G 2005/02
USPC ............................................. 310/309, 11, 308
See application file for complete search history.

(56) References Cited

U.S. PATENT DOCUMENTS

| | | | | |
|---|---|---|---|---|
| 1,084,594 A | * | 1/1914 | Norton et al. | H02N 1/008 310/309 |
| 2,279,586 A | * | 4/1942 | Bennett | F04D 33/00 96/97 |
| 3,225,225 A | * | 12/1965 | Wattendorf | H02N 3/00 310/309 |
| 3,582,694 A | * | 6/1971 | Gourdine | H02N 3/00 310/10 |
| 3,792,293 A | * | 2/1974 | Marks | H02N 3/00 310/11 |
| 4,072,477 A | * | 2/1978 | Hanson | B03C 3/16 95/71 |
| 4,218,629 A | * | 8/1980 | Kayukawa | H02K 44/10 310/11 |
| 6,504,308 B1 | * | 1/2003 | Krichtafovitch | H01J 49/04 315/111.21 |

OTHER PUBLICATIONS

Fernández-Yáñez et al. "Thermal management of thermoelectric generators for waste energy recovery". Applied Thermal Engineering 196 (2021) 117291. Jun. 30, 2021. (Year: 2021).*

* cited by examiner

*Primary Examiner* — Burton S Mullins
(74) *Attorney, Agent, or Firm* — Ruben Alcoba, Esq.

(57) ABSTRACT

A electrical generator that uses wasted heat that emanates from an external heat source to generate electricity. The generation of electricity is based on known thermo-electric principles, electro-chemical principles, magneto-hydro-dynamic principles, the Hall Effect, and electro-static principles. The electrical generator uses a plurality of plates of different thermo-electric conductive materials to generate electricity. Those plurality of plates are stacked on top of the other in a certain order. Each plate has the same array of through holes. Those through holes form an array of lineal channels through the stacked plurality of plates.

20 Claims, 13 Drawing Sheets

ELECTRIC GENERATOR

CROSS REFERENCE TO RELATED APPLICATION

This application is a Continuation-in-Part (CIP) application of and claims the benefit of and priority to U.S. application Ser. No. 17/231,211, filed on Apr. 10, 2021, all of which application is incorporated by reference herein in its entirety.

BACKGROUND

Without a doubt, electricity is a main factor in humankind's development. However, in spite of its importance, all existing methods used to generate electricity are plagued with inefficiency, sky-high costs, environmental threats and other issues and risks summarized below:

Non-renewable energy electrical generators: About 89% of the electricity produced worldwide is obtained from generators that use non-renewable energy sources (nuclear/fossil) and require the use of paddles or turbines (which consume substantial energy in the process.). Fossil-fuel-based electrical generators achieve only between 25% and 35% efficiency levels and are harmful to the environment, contributing to pollution and global warming. Nuclear-based electrical generators achieve only 55% efficiency levels and require large facilities, have high safety risks, produce radioactive waste and also contribute to global warming Renewable energy (hydro/wind) electrical generators: About 10% of the electricity produced worldwide is obtained from generators powered by wind, hydro or other renewable energy sources. Wind based electrical generators rely on wind patterns to function properly, sometimes do not produce electricity when needed, have to be set up far from urban areas and also affect wildlife. Hydro based electrical generators have 85% efficiency, but they are very limited by geo-location, needs large space to be implemented and have high cost of installation.

Renewable energy (solar) electrical generators: Only about 1% of the electricity produced worldwide is obtained from solar-powered electrical generators. Solar based electrical generators are limited to obtaining an average of 5 hours of energy from the sun and have to be cleaned and maintained to work at optimal efficiency limited to 23-30% till today. This technology needs large space to be installed, is only scalable in two dimensions, depends on the weather and is limited by geo-location. Solar generators' technology is presently cost prohibitive, and its production process has a significant negative impact on the environment.

Thermoelectric generators: Thermoelectric generators have been proposed to create electricity, yet to date they have not proven to be an efficient alternative source of electricity. Each year, billions of dollars in energy are lost in the form of low-grade waste heat, a common byproduct of fuel consumption. As an example, annual world waste heat equating to 12 years of electricity consumption in the EU. That kind of data shows the extreme importance of rethinking on a way to generate electricity from a waste thermo source. The present invention is focused on a new form of generator that converts thermo-chemical energy into electricity. The heat source is preferred to be a waste from any existing process, either artificial (man-made) or natural.

The electrical generator of the present invention can be built with materials widely available in nature, also materials that are presently obtained from recycling, and at the same time materials that are recyclable.

The electrical generator of the present invention is scalable in all three dimensions, being very efficient in the use of space.

The electrical generator of the present invention can be connected to an electrical grid or it can work apart from the electrical grid.

The electrical generator of the present invention can complement other forms of electrical generators that need to be cool down or have heat as byproduct or waste.

The electrical generator of the present invention does no use paddles or turbines to generate electricity, avoiding their inefficiency.

The electrical generator of the present invention does not require solar energy but can use it.

The electrical generator of the present invention does not require air flow to generate electricity.

The electrical generator of the present invention is not limited by geo-location

SUMMARY

The electrical generator of the present invention uses wasted heat that emanates from an external heat source to generate electricity. The generation of electricity is based on known thermo-electric principles, electro-chemical principles, magneto-hydro-dynamic principles, the Hall Effect, and electro-static principles.

The electrical generator of the present invention uses a plurality of plates of different thermo-electric conductive materials to generate electricity. Those plurality of plates are stacked on top of the other in a certain order. Each plate has the same array of through holes. Those through holes form an array of lineal channels through the stacked plurality of plates.

The electrical generator of the present invention works when a certain fluid (e.g. an electrolyte) passes through the mentioned lineal channels of the stacked plurality of plates, wherein a thermo-chemo-electric interaction occurs between the plates and the fluid. That interaction changes the distribution of electrical charges within the plates, and as a result, an electrical direct current is generated.

The electrical generator of the present invention is held within a housing that has an inlet and an outlet. The inlet allows the fluid to pass through the plurality of lineal channels defined within the stacked plurality of plates until the fluid reaches the outlet of the housing.

The electrical generator of the present invention has a positive terminal and a negative terminal that are configured to connect to an electrical circuit load. The positive terminal is attached to a first plate and the negative terminal is attached to a last plate of the stacked plurality of plates.

The stacked plates are formed by stacking a minimum of three plates to a maximum of N plates, what is considered a cartridge. An embodiment of the present invention can be an electrical generator that only has one cartridge.

The electric generator of the present invention can be comprised of more than one cartridge making this electrical generator scalable in power output when additional power output is needed.

To increase the electrical charges flow created with the present invention, the fluid can be doped with ions. Although the present electrical generator can work without the fluid flowing, the electric generator has to store (keep) the fluid within the array of lineal channels of the electric generator to generate electricity.

With no electrical load connected to the electrical generator, if the lineal channels get without fluid, the electrical generator works as a capacitor keeping the generated electrical power ready to deliver it to an electrical load.

The electrical generator of the present invention has industrial, residential, automotive, and other uses.

An object of the present invention is to provide an electrical generator that is scalable.

Another object of the present invention is to provide an electrical generator that can be controlled and regulated based on the energy demanded.

Yet another object of the electrical generator of the present invention is to provide a mobile electric generator.

Yet still another object of the electrical generator of the present invention is that it can be used with in any production process that has fluid circulation.

Yet still a further object of the electrical generator is that it can provide an environmentally friendly generator.

A further object of the electrical generator of the present invention is that it can provide a relatively quiet generator.

Yet a further object of the present invention is that it can provide a generator that can use any type of fluid that can carry electrical charges.

Yet still a further object of the present invention is that it can provide a generator that can work in extreme environments.

DRAWINGS

These and other features, aspects, and advantages of the present invention will become better understood with regards to the following description, appended claims, and drawings where:

FIG. 1 Shows a general schematic of the electrical generator (100) of the present invention. Having the electrical generator (100) inserted within a housing (10) of a given system, an inlet (10a) connected to the inlet channel (10e) allowing a fluid (300a) from a fluid source (300) to reach inside the electrical generator (100) and an outlet (10b) connected to the outlet channel (10f) for the fluid (300a) to get out of the electrical generator (10), The positive terminal (12) of the electrical generator (100) is at a first position (10c) of a cartridge (80) and a negative terminal (14) is at a last position (10d) of the cartridge (80) of the electrical generator (100).

FIG. 2 Shows an schematic of a cartridge (80) of the electrical generator of the present invention, wherein a plurality of plates from plate A, to plates B(n) and C(n) stacked one on top of each other, the lineal channels (40), the fluid (300a), the direction in which the fluid (300a) flows, the three minimum allowed amount of plates (70) of the electrical generator, the electrical generator made of only one cartridge (80) using one plate A and N pairs of plates B(n) and C(n), the positive terminal (12) connected to a first plate A, the negative terminal (14) connected to a last plate C(n) and the separators (S) of the present invention are highlighted.

FIG. 3 Is a diagram that shows one plate of the plurality of stacked plates of the cartridge (80) of the electrical generator of the present invention, having an array of the plurality of through holes (30) on a plate.

FIG. 4 Shows a perspective drawing of the cartridge (80) of FIG. 2 formed by the plurality of plates A, B(n) y C(n) piled in a column between the separators (S). Plates are stacked in the flowing order from top to bottom: A, B(1), C(1), B(2), C(2) ... B(n-1), C(n-1), B(n) and C(n). Also is shown the array of through holes (30) in an hexagonal distribution array, aligned and forming the channels (40) where the fluid (300a) flows. The positive terminal (12) is attached to plate A and negative terminal (14) is attached to the last plate C(n);

Figure 7:
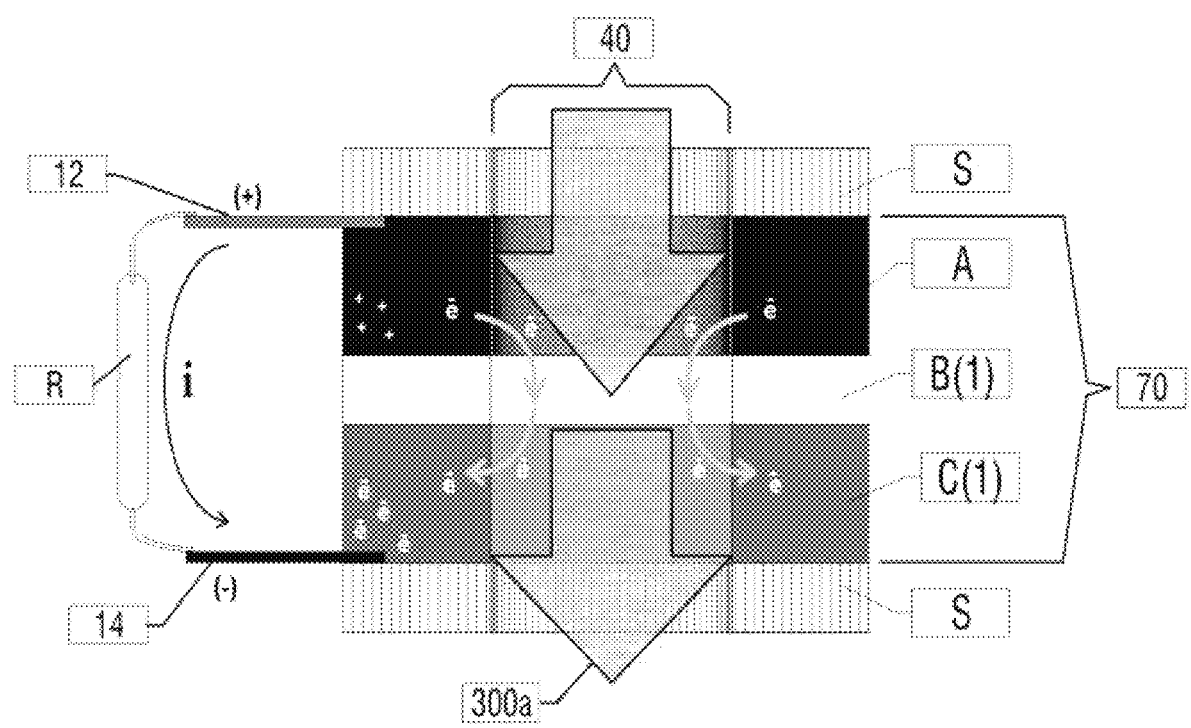

FIG. 7 Shows a diagram of one lineal channel (40) of a cartridge(80) of the electrical generation of the present invention, based on the three minimum allowed amount of plates (70) in which only one A, one plate B and one plate C between the cartridge's separators (S). where one plate A, one plate B and one plate C are interacting with the fluid (300a) having a electrical charges movement between plates A and C through the fluid (300a). A resistive electrical load (R) is connected between the positive terminal (12) and the negative terminal (14) through which the generated direct electrical current (i) flows.

Figure 8:
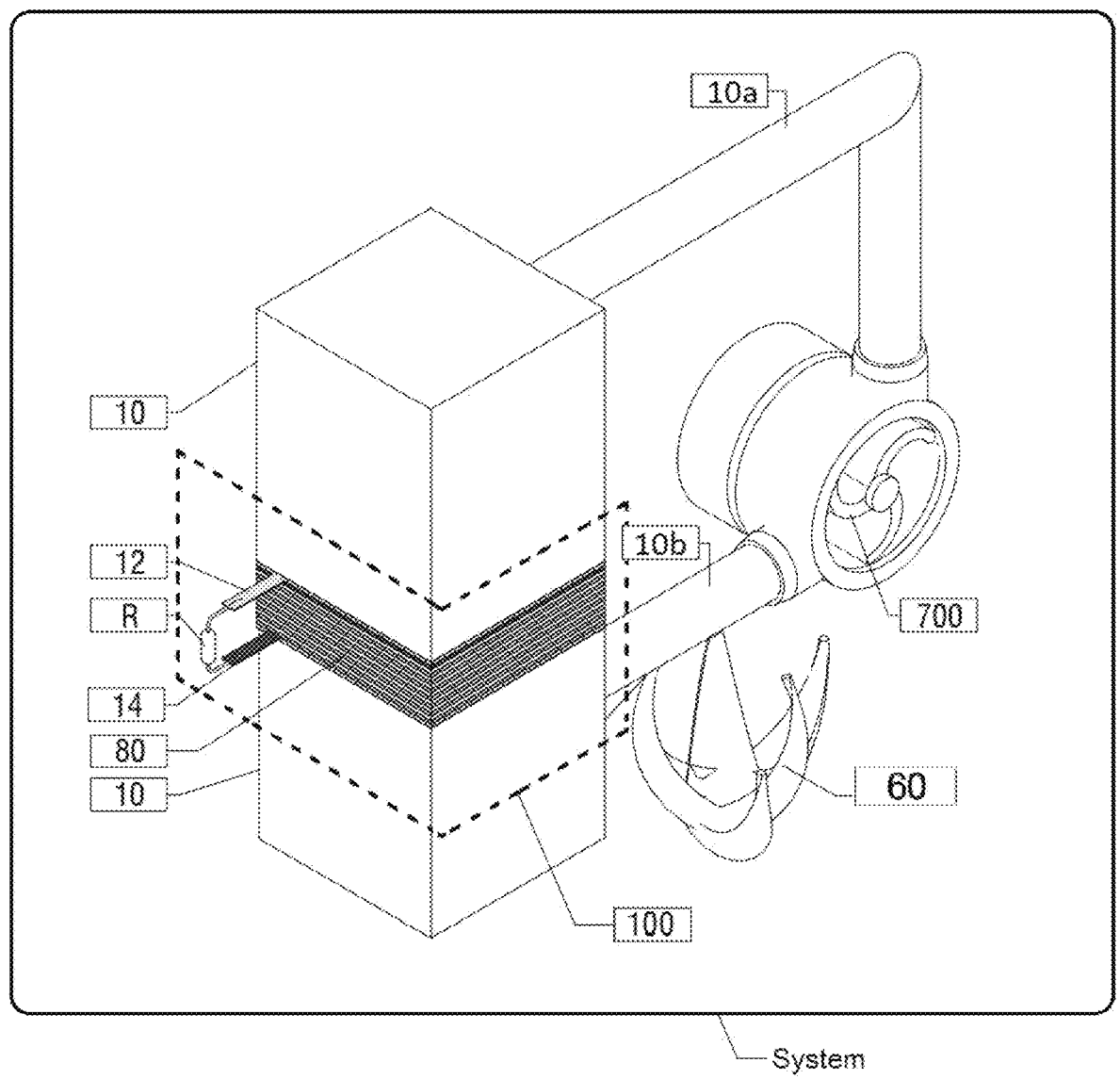
Figure 9:
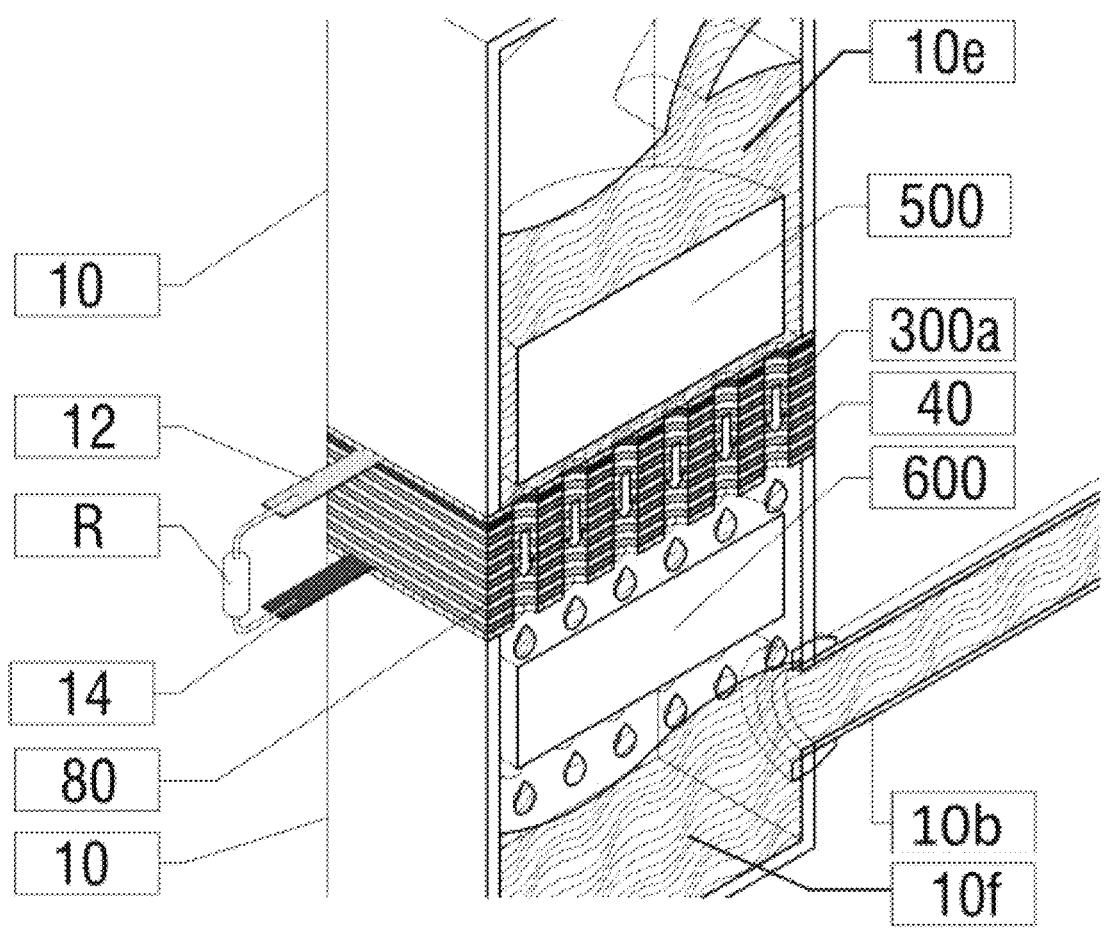
Figure 10:
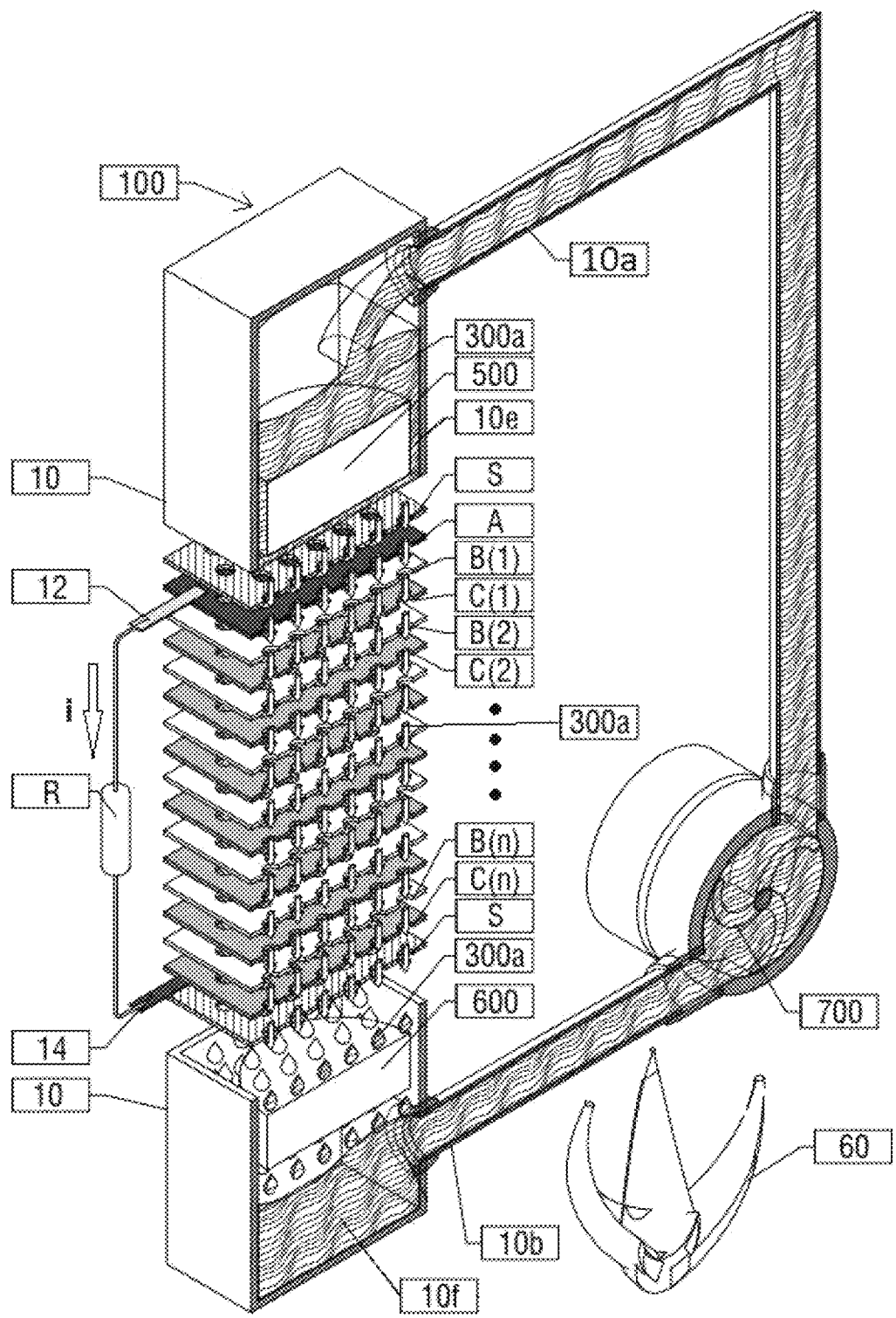
Figure 11:
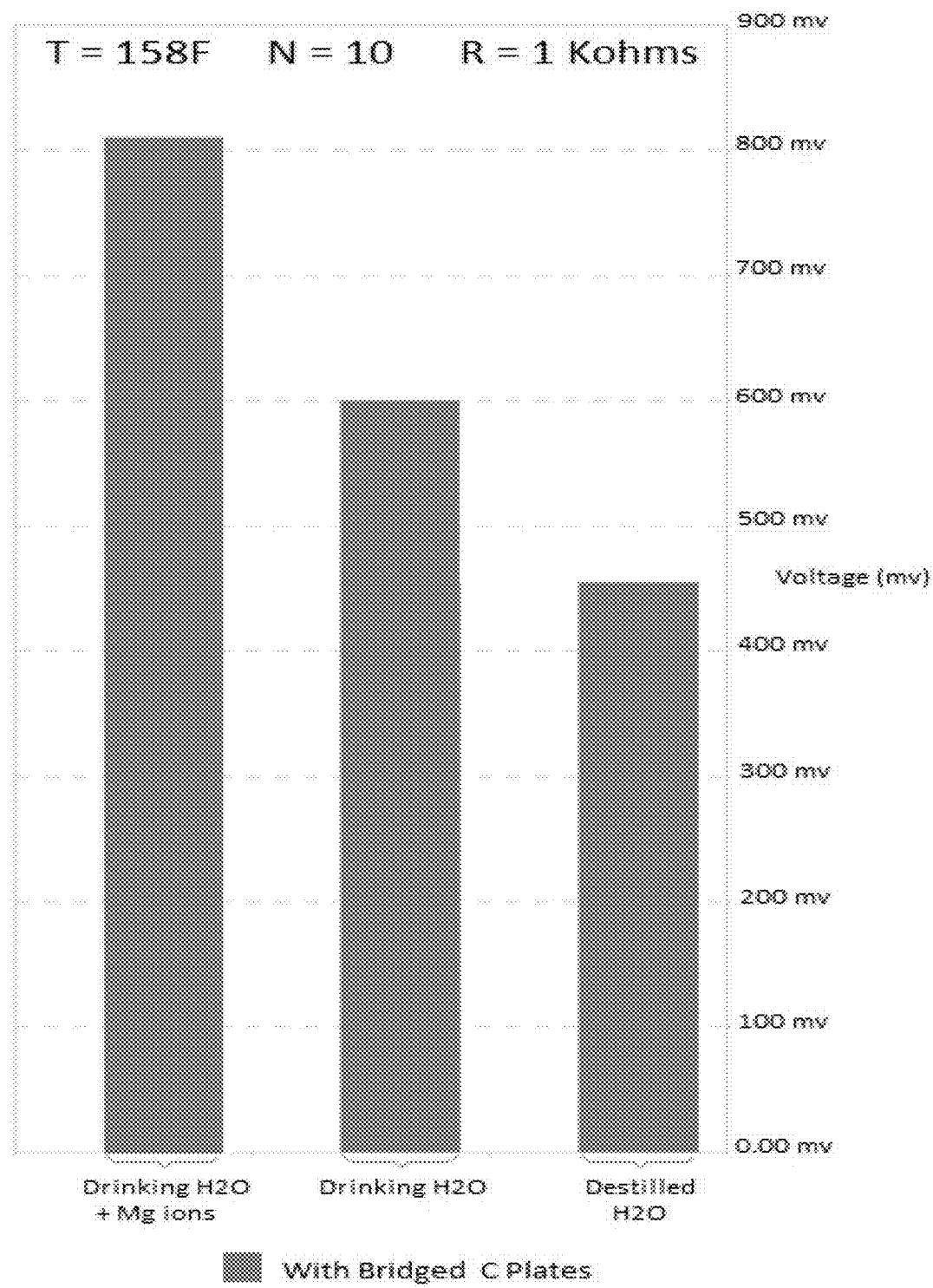
Figure 11B:
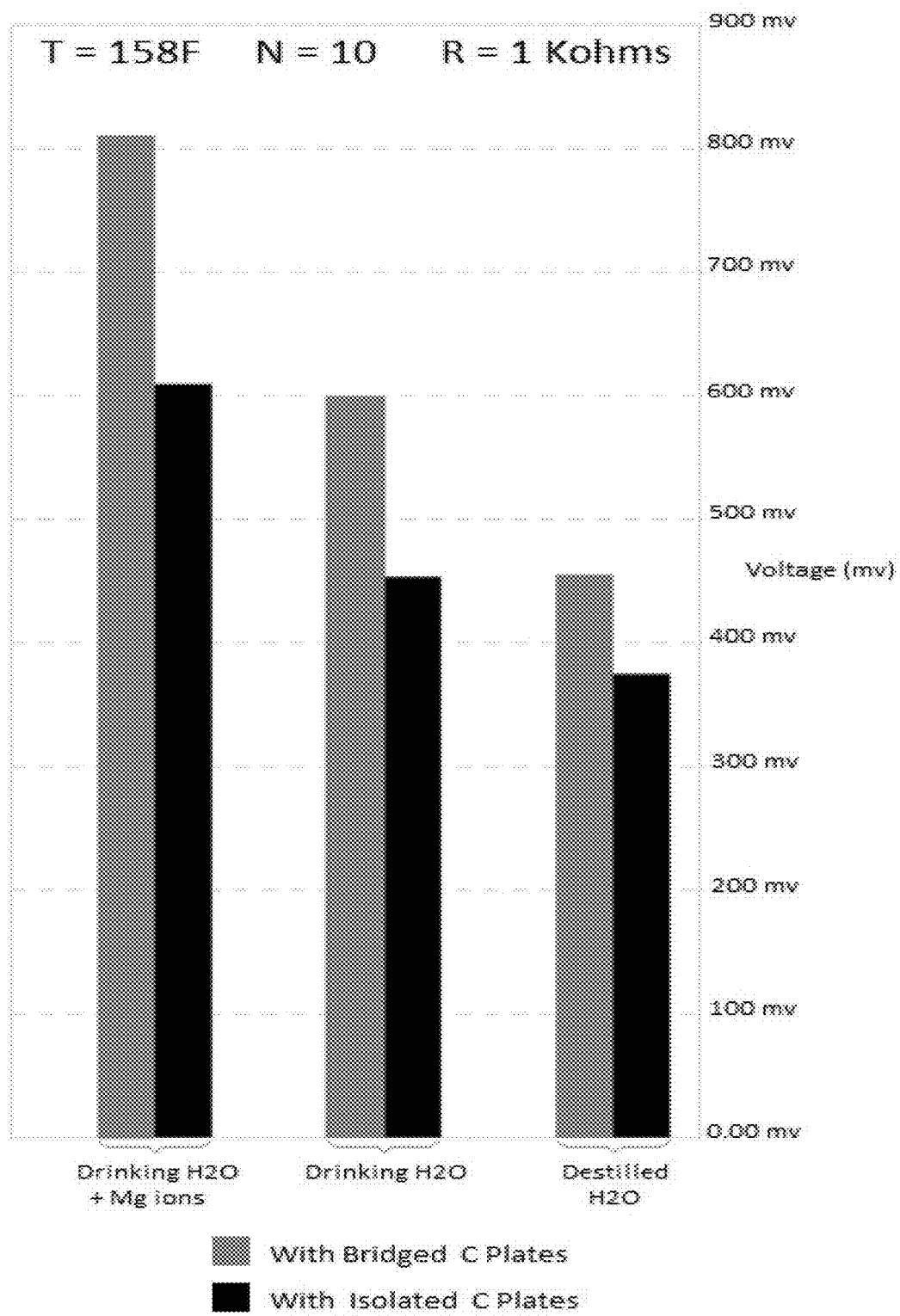

FIG. 8 Shows a perspective drawing of the housing (10) having the cartridge (80) between the inlet channel (10e) and the outlet channel (10f) where fluid (300a) is present at a temperature (T) provided by the wasted heat from a heat source (60). The pump (700) makes the fluid (300a) of a given system to flow within the electrical generator (100). There is a resistive electrical load (R) connected between positive terminal (12) and negative terminal (14). Also, a dot line indicates the selected area shown in FIG. 9;

FIG. 9 Shows a perspective drawing of a cross section in the direction of a row of the lineal channels (40) of the electric generator (100) of in FIG. 8, indicating how fluid (300a) goes through channels (40) serving as a medium for the physical-chemical interaction between plates A, B and C. The mentioned physical-chemical interaction between plates A, Bs and Cs produces the movement of electrical charges between the plates A and Cs, generating the electrical direct current (i) that flows through the electrical resistive load (R) that is connected to the positive terminal (12) and the negative terminal (14). Magnetic poles (500) and (600) represent how the electrical generator (100) can be shield by a magnetic field (M) between magnetic poles (500) and (600);

FIG. 10 Shows a general diagram of a given system, where the electrical generator of the present invention comprised for only one cartridge (80) is inserted inside the housing (10), between the inlet channel (10e) and the outlet channel (10f), the fluid (300a) is circulating at a temperature (T), Heat source (60) and pump (700) are indicated too. Resistive load (R) is connected between positive terminal (12) and negative terminal (14) and the generated direct electrical current (i) is indicated with its conventional direction. Plates A, B y C from cartridge (80) are separated from each other in this drawing to show the way they are organized. In a working electrical generator, each plate's surface of the cartridge (80) is liquid tight bonded with next plate's surface, fluid (300a) can only flow through or stay inside of the channels (40);

FIG. 11 Shows a graphic of the output voltage values generated by the electrical generator of the present invention, using different fluid in each case, Distilled H2O, Drinking H2O and Drinking H2O dopped with Magnesium (Mg) ions. The grey colored bars indicate voltage values, units are in millivolts (mv). In each of those cases, the fluids are at temperature T=158 F, A plate is made of Graphite, B plates are made of Silicone, C plates are made of Aluminum, the number of pairs of plates B and C is 10 (N=10), each plate has a dimension that is four inches in width, four inches in length, and one-thirty second of an inch in height. Each plate has an hexagonal array of 604 holes of one-eighth of an inch of diameter, each C plate is bridged to the previous C plate using an electro-conductive bridge (400) and the Resistive load R=1 k ohms FIG. 11b Shows a comparison between voltage output values of the electrical generator of the present invention when each C plate is bridged to the previous C plate with electro-conductive bridges (400) (represented by grey colored bars values in the graphic) and when the C plates are not bridged (represented by black colored bars values in the graphic). Voltage units are in millivolts (mv).). In each of those cases, the fluids are at temperature T=158 F, A plate is made of Graphite, B plates are made of Silicone, C plates are made of Aluminum, the number of pairs of plates B and C is 10 (N=10), each plate has a dimension that is four inches in width, four inches in length, and one-thirty second of an inch in height. Each plate has an hexagonal array of 604 holes of one-eighth of an inch of diameter and the Resistive load R=1 k ohms.

Figure 12:
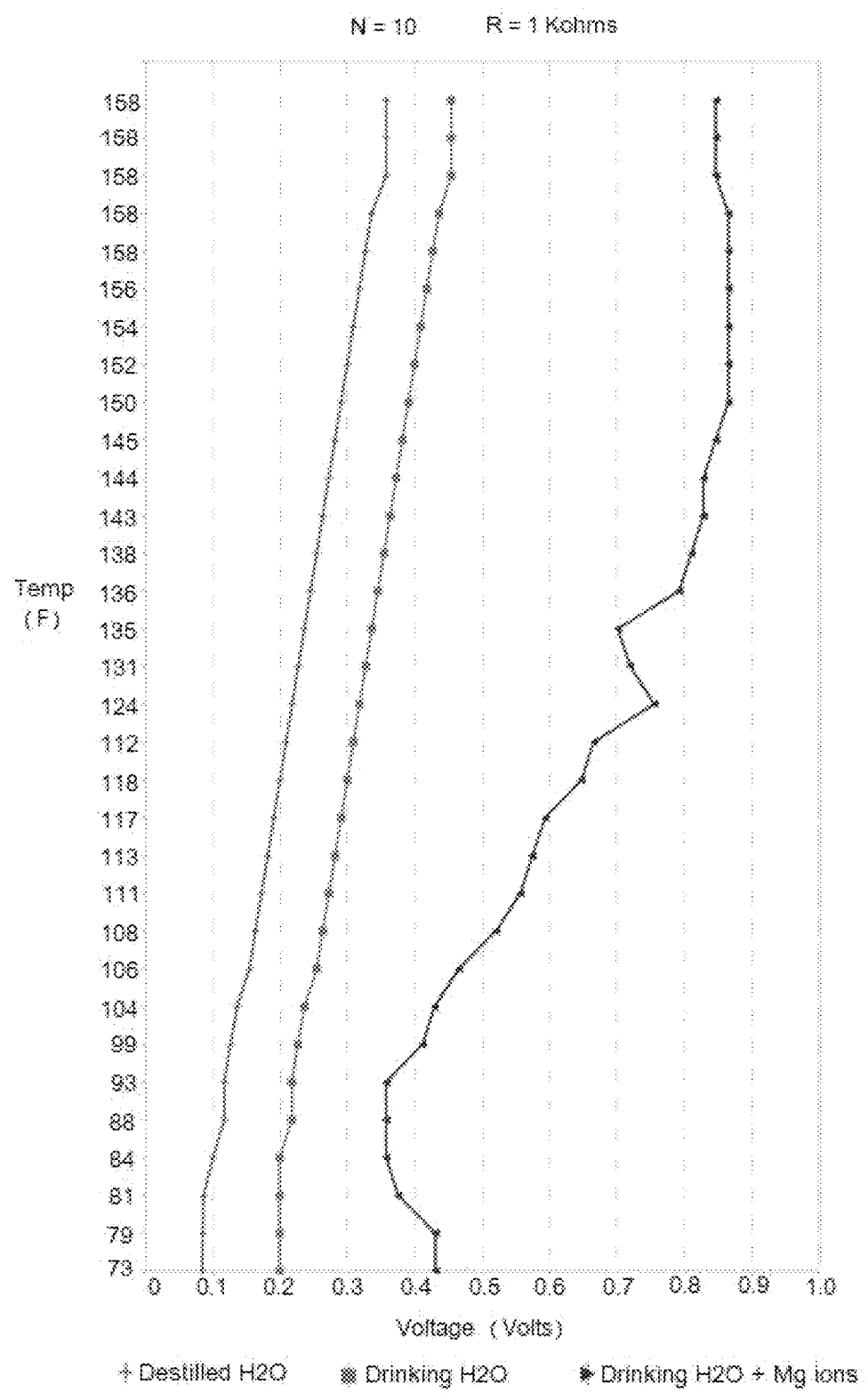

FIG. 12 Shows the output voltage values, in units of millivolts (mv), generated by the electrical generator of the present invention versus the fluid temperature in a range from 73 F to 158 F, in each case using different fluid; Distilled H2O, Drinking H2O and Drinking H2O doped with Magnesium (Mg) ions. In each of those cases, plate A is made of Graphite, plates Bs are made of Silicone, plates Cs are made of Aluminum, the number of pairs of plates B and C is 10 (N=10), each plate has a dimension that is four inches in width, four inches in length, and one-thirty second of an inch in height, each plate has a hexagonal array of 604 holes of one-eighth of an inch of diameter, each C plate is bridged to the previous C plate using an electro-conductive bridge (400) and the Resistive load R=1 k ohms

DESCRIPTION

Figure 1:
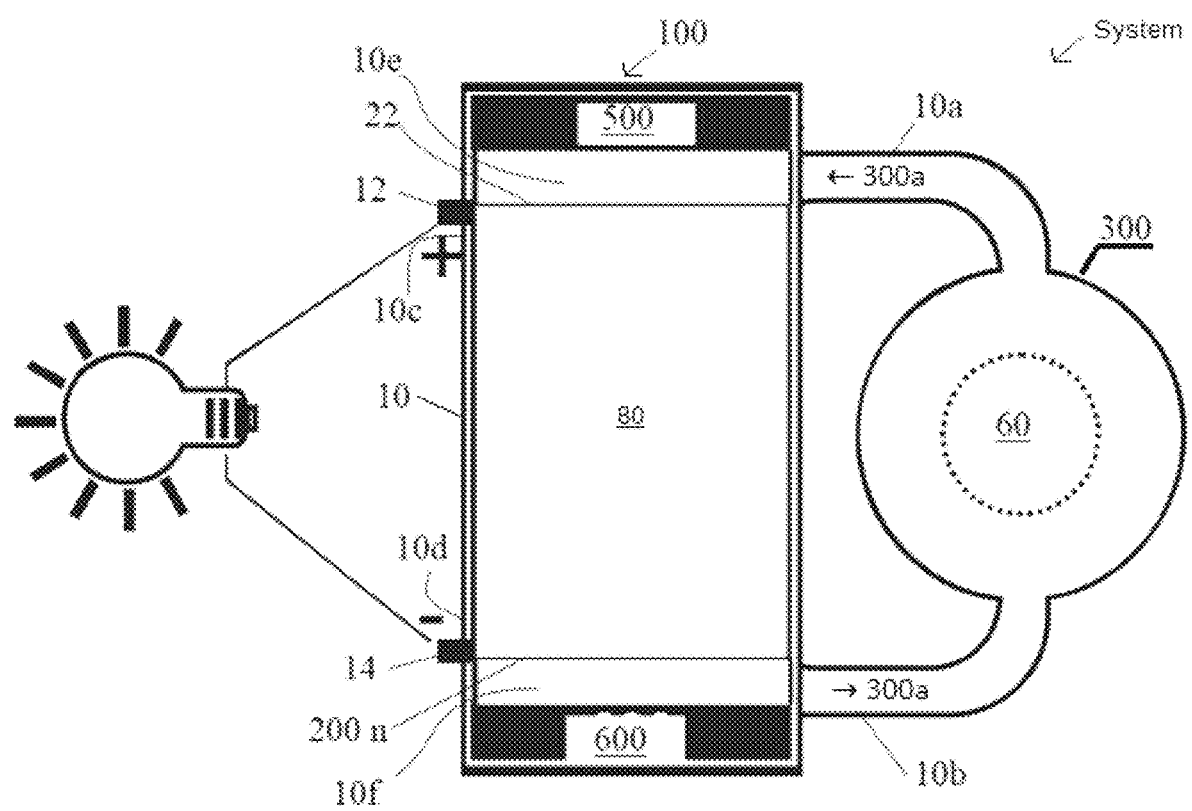
Figure 2:
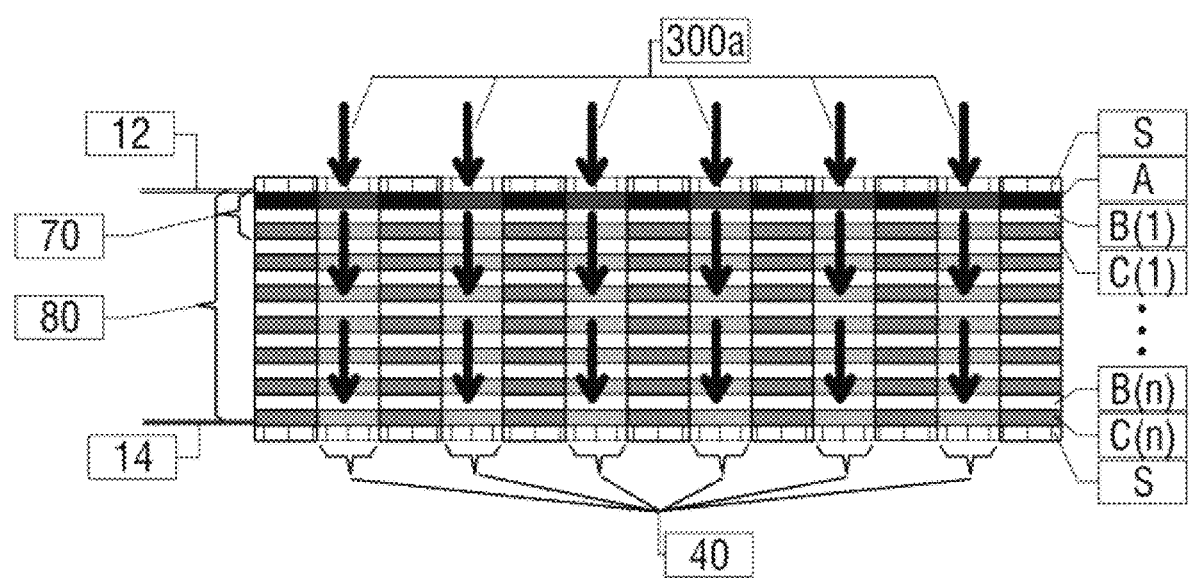
Figure 3:
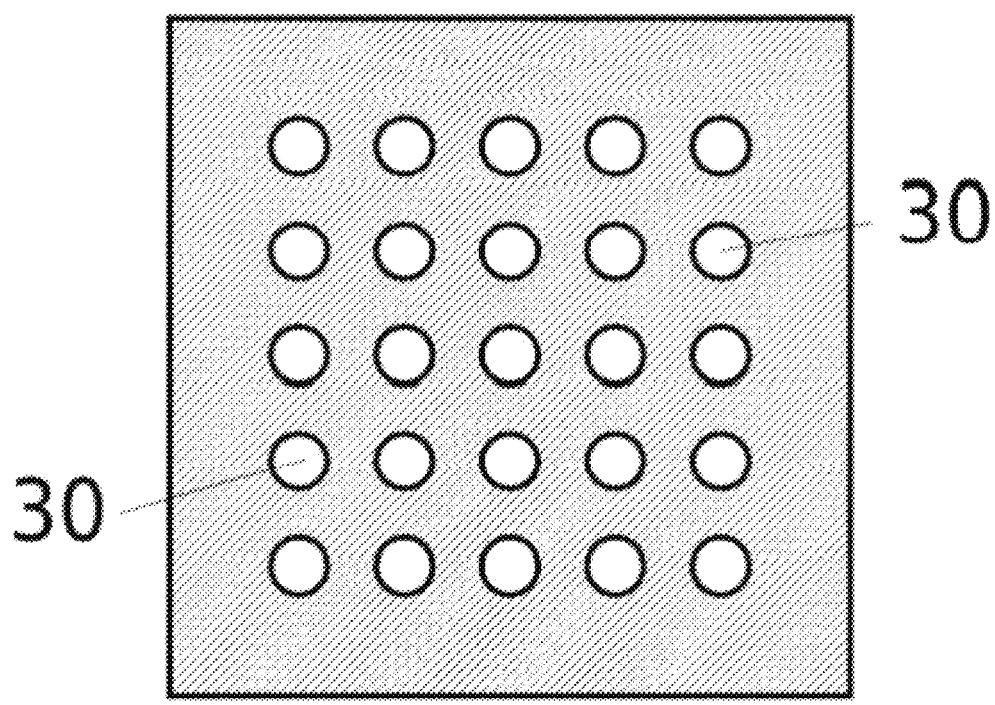

As seen in a general diagram of FIG. 1, the electrical generator (100) is built to work inserted within a housing (10) of a given system that has an inlet (10a) and an outlet (10b). There is a positive terminal (12) at the first position (10c) of the electric generator (100) and a negative terminal (14) at last position (10d) of the electrical generator (100).

As shown in FIGS. 2-10, the electrical generator (100) of the present invention comprises of a plurality of plates (80), the plurality of plates (80) can also be referred as a cartridge (80). Each individual plate of the plurality of plates will be referred as an A plate, a B(1) plate, a C(1) plate, a B(2) plate, a C(2) plate to a B(n) plate, and a C(n) plate and the plurality of plates are stacked as a column, the A plate will be the top first plate and the C(n) plate will be the lower last plate, the plurality of plates are stacked so that below the A plate there is always a B plate and below the B plate there is always a C plate and below the C plate there is another B plate and below the B plate there is another C plate until reaching a last C(n) plate, the plurality of plates are compressed together to form a bond that will be impermeable to any liquid. wherein the A plate is made of a thermo-electrical conductive material, and each B plate is made of a electrical insulator material, and each C plate is also made of a thermo-electrical conductive material, yet the C plates thermo-electric conductive material is different from the thermo-electric conductive material of the A plate.

The A plates and the C plates are made of any thermo-electric conductive material that is either pure or doped. The A plates and the C plates are made of either: a Li, a Rb, a K, a Ca, a Na, a Mg, a Al, a Mn, a Zn, a Cr, an Fe, a Ni, a Sn, a Pb, a Hg, a Cu, a Ag, a Pt or a C material; or of other thermo-electric conductive variants that can be either of a carbon fiber, a Graphite, a Graphene and Carbon material.

B plates are made of any non electric conductive material, that is either a pure or a doped material. B plates are made of either a Silicone, a Teflon, a Ceramic, a Glass and some Epoxy material.

The stacked A plates, B plates and C plates define an identical array of through holes (301, thereby forming a plurality of linear channels (40) from the first plate A to the last plate C(n) within the stack of plates. The A plate will be referred as a first plate and the C(n) plate will be referred as either an N plate or a last plate, hereinafter.

A fluid source (300) that has a fluid (300a), the fluid being of a certain temperature (hereinafter "T") is attached to the inlet (10a) of the housing (10). The fluid (300a) runs from the inlet channel (10e) of the housing (10) into the electrical generator (100) through the linear channels (40) of the plurality of plates, the A, the B(1), the C(1), the B(2), the C(2), the B(n), and the C(n) plate and go out to the outlet channel (10f) of the housing (10). The fluid (300a) can be of any liquid that carry ions.

As shown in FIG. 7, when the electrical generator (100) has the fluid (300a) at Temperature (T) inside the linear channels (40), an electrical charges changes its distribution inside the A plates and C plates when the fluid passes through holes (30) of the thermo-electric conductive materials of the A plates and C plates. At the same time the fluid (300a) that has a certain ion concentration, acts as a bridge for the electrical charge to be able to move between the plurality of plates. The process described above creates a differential of electrical potential between the positive terminal (12) attached to the A plate and the negative terminal (14) attached to the Cn plate. The differential of electrical potential between positive terminal (12) and the negative terminal (14) is defined by the electro-chemical potential of the plurality of plates.

Having an electrical load (R) connected between the positive terminal (12) and the negative terminal (14) of the electric generator (100), a direct electrical current (i) flows through the mentioned electrical load (R).

The electrical generator of the present invention raises its voltage output and current intensity generated when fluid circulation begins and continues to rise to up to a limit of electrochemical potentials of the stacked plurality of plates in relationship with the fluid temperature (T).

Figure 4:
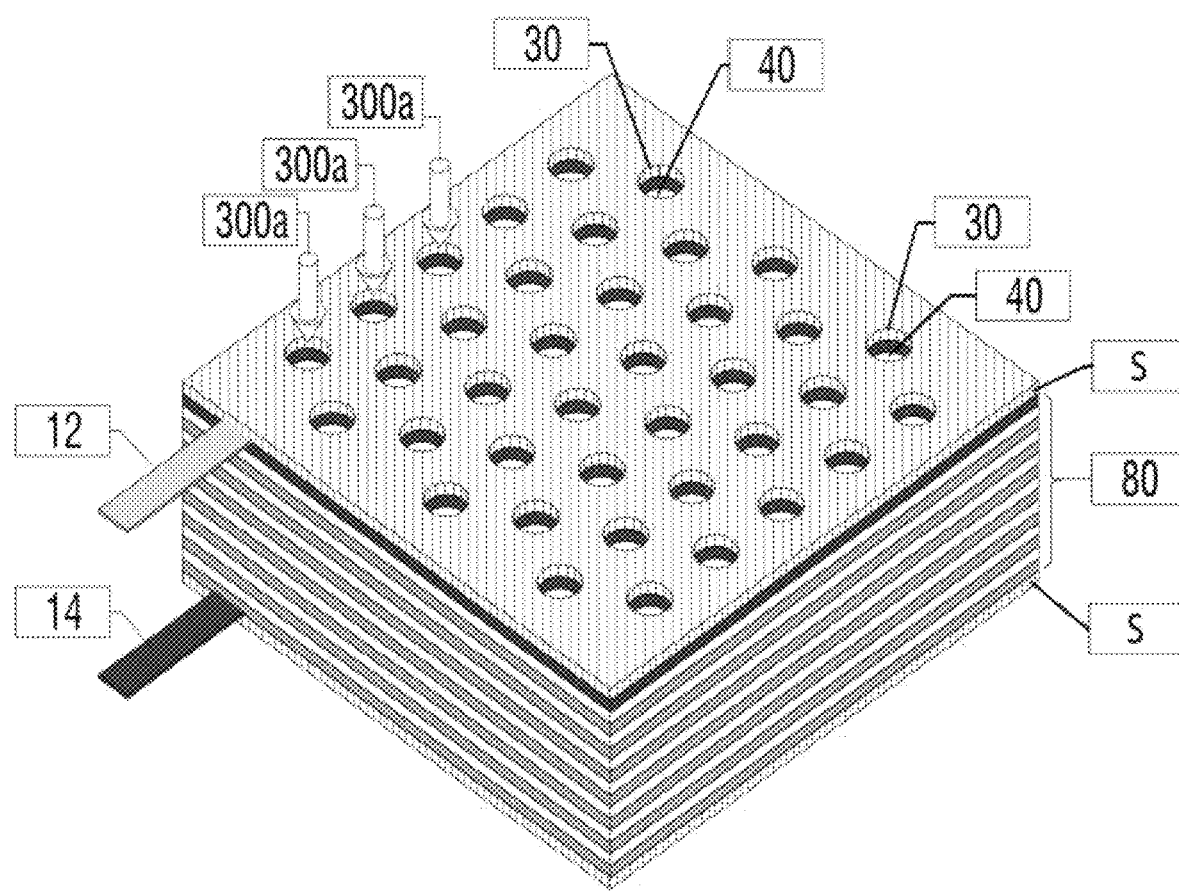
Figure 5:
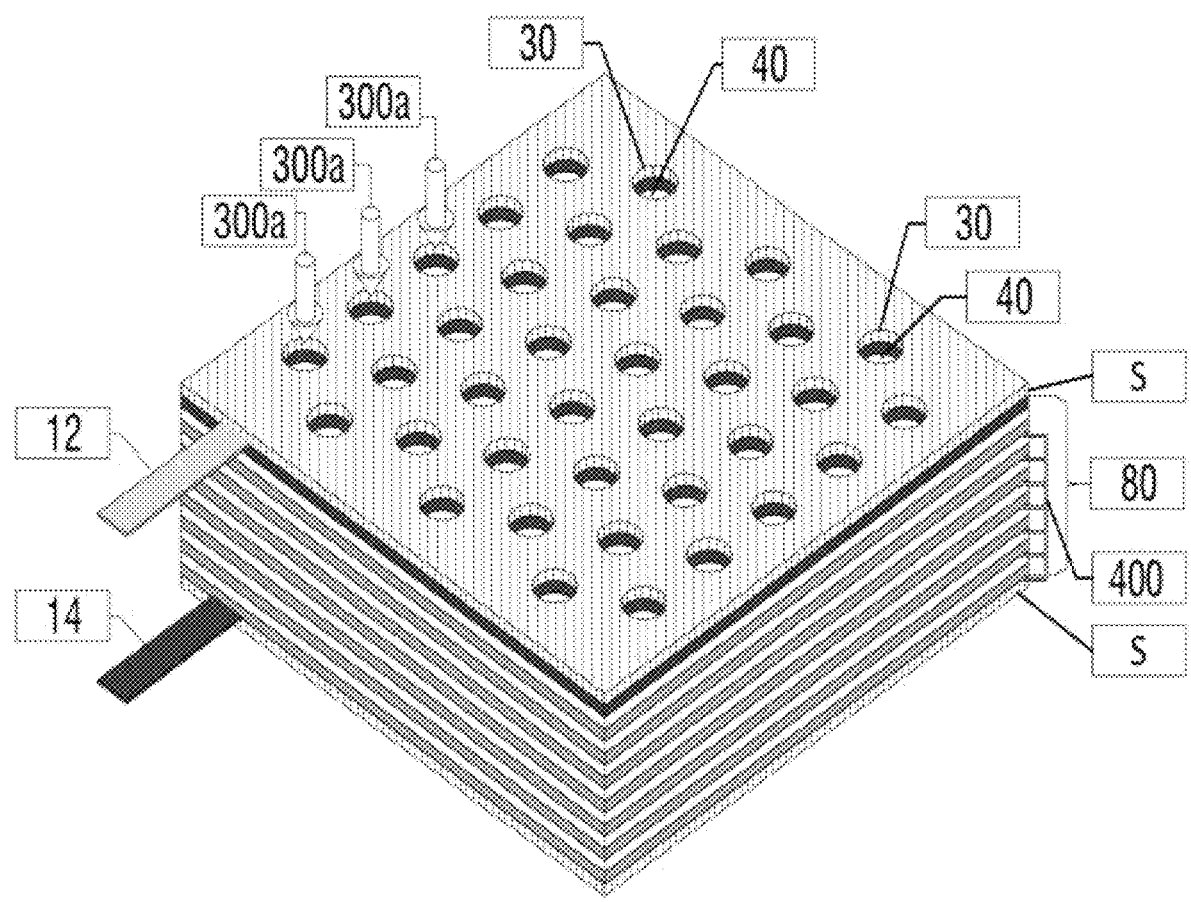
FIG. 5 Shows a perspective drawing of the cartridge (80) from FIG. 4 having plates C(n) interconnected with a plurality of electrical conductive bridges (400)
Figure 6:
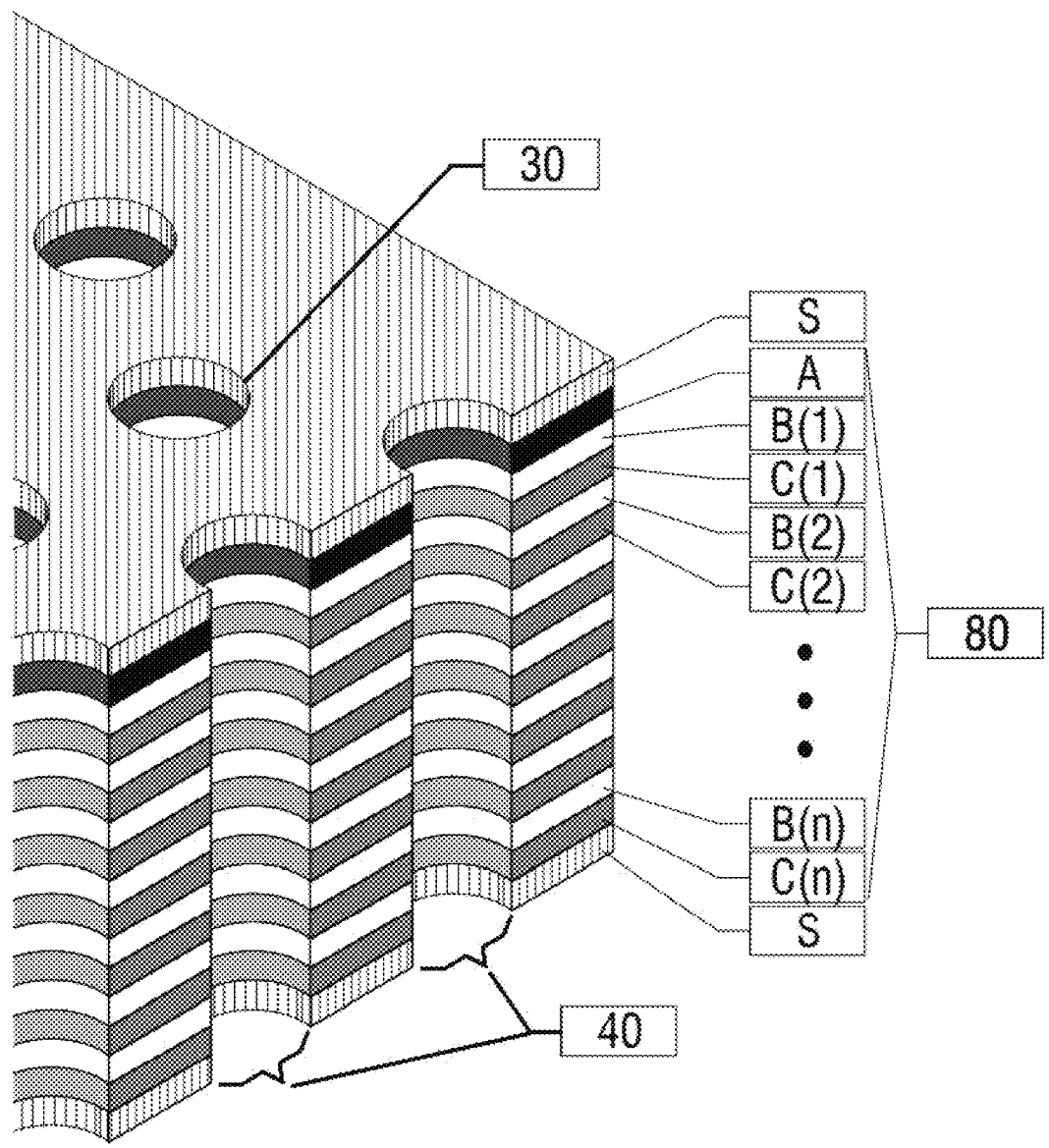
FIG. 6 Shows a perspective drawing of a portion of a cartridge (80) from FIG. 2 with a cross section in the direction of the row of the lineal channels (40), the separators (S), the plurality of the stacked plates of the electrical generator (100) and holes (30) are also indicated.

As shown in FIG. 4, The electrical generator (100) of the present invention has the option to bridge each C plate with its previous C plate within a cartridge (80) to increase the power generation by a factor of twenty to twenty-five percent. FIG. 11b shows that result in a given example.

The electrical generator of the present invention, generate electricity in the form of direct electrical current due to:
1. The A plates being made of a different thermo-electric conductive material than the C plates;
2. All the B plates are made of the same non electric conductive material;
3. All the C plates are made of the same thermo-electric conductive material.
4. The A plates and the C plates have a difference of electro-chemical potential between them;

5. The B plates work as an electric isolator between the surfaces of the A plate and the C(1) plates and between all other C plates;
6. The plurality of plates are stacked in the following order: A, B(1), C(1), B(2), C(2) to B(n), C(n);
7. The plurality of plates, A, Bs and Cs, have an identical array of through holes (30);
8. The plurality of plates, A, Bs and Cs, are stacked and aligned so that the through holes (30) form a linear channels (40), the trough holes (30) define an inner wall;
9. There exist a liquid-tight bond between each adjacent plate of the stacked plurality of plates;
10. The Fluid (300a) that runs through the channels (40) interacts with the inner walls of the through holes of the plurality of plates, thereby the fluid (300a) works as a bridge that allow the electrical charges to move from the A plates to C plates;
11. There are ions moving within the fluid (300a) that help the electrical charges to move from the A plates to the C plates; and
12. There exists a certain value of Temperature (T) that helps the electrical charges to move within plurality of plates, thereby changing electrical charge distribution within the plurality of plates.

The power output of the electrical generator of the present inventions is based directly on:
1. The difference of electro-chemical potential between the A plate and the C plates;
2. The amount of lineal Channels (40);
3. The amount of C plates on the cartridge (80);
4. The temperature (T);
5. The ion concentration within the Fluid (300a); and
6. The way C plates are interconnected.

In an embodiment of the present invention, the fluid source (300) comprises of a heating element (60), also referred to as a heat source (60). The mentioned heat source (60) represents the wasted thermo-energy of a given system, man-made or natural, from where the electrical generator of the present invention is able to generate electricity.

In some embodiments of the present invention, the fluid source (300) is a re-circulating fluid from a pump (700) that comprises a heating element (60) or wasted heat source (60)

In some embodiments of the present invention, the plurality of plates A, B(1), C(1), B(2), C(2) to B(n), C(n) are grouped as cartridge (80) of plates in order to replace or clean the separated cartridge (80) of plates.

In other embodiments, there will be more than one cartridge (80) placed within the electrical generator (100).

In other embodiments of the present invention, the electrical generator comprises a pair of magnets (500), (600), each magnet has a different polarity. A first magnet (500) of the pair of magnets is placed inside the inlet channel (10e) before the first separator (S) of the electrical generator (100) and a second magnet (600) is placed inside the outlet channel (10f) after the last separator (S) of the electrical generator (100). The strength of the magnetic field of the pair of magnets (500) and (600) produces a Magneto-hydro-dynamic effect (MHD) on the fluid (300a), that effect is used to control the amount of electricity that the electrical generator (100) generates.

The electrical energy generated by the electrical generator (100) of the present invention can be regulated by controlling one or several of the following factors: the flow rate of the fluid (300a) and/or, the operating temperature T and/or the amount of lineal channels (40) available for the fluid (300a) to flow, and/or the ion concentration within the fluid (300a), and/or the amount of bridged C plates within a cartridge (80) and/or also the amount of cartridges of the electrical generator (100).

It is foreseen that the electrical generator (100) will have a control that will control the electrical energy produced by the electrical generator (100).

Wide range of the possible options of the geometry of the plates, the areas of the plates, the thickness of the plates, the different distributions of plates, the materials used in each plate, the array of through holes within the plates, the array of channels generated by the through holes and the type of fluid used to build the electrical generator, makes the electrical generator of the present invention flexible, structural, and scalable.

The density of electrical energy generated depends on the density of the grid of lineal channels (40), the plate's area, the amount of the plates, materials of the A plates and the C plates, the fluid (300a) used and the temperature (T).

The fluid is any fluid that can carry a electrical charges and be able to absorb heat from a heat source. In some embodiments the fluid (300a) may re-circulate, in some other embodiments may not re-circulate. For example, the fluid source can be a body of water, where the water flows into the inlet of the electrical generator and there can be a magnifying element that is placed above the inlet of the electric generator that will direct sunlight on the fluid that is above the inlet (the magnifying element would work as the heating element in this embodiment).

An advantage of the present invention is that it provides an electrical generator that is scalable.

Another advantage of the present invention is that it provides an electrical generator that is controlled and regulated based on the energy demanded.

Another advantage of the electrical generator of the present invention is that it provides a mobile electrical generator.

Yet still another advantage of the electrical generator of the present invention is that it can be used with in any production process that has a fluid circulation at certain temperature.

Yet still a further advantage of the electrical generator of the present invention is that it provides an environmentally friendly generator.

A further advantage of the electrical generator of the present invention is that it provides a relatively quiet generator.

Yet a further advantage of the present invention is that it provides an electrical generator where the fluid can re-circulate or not within a given system where the electrical generator is installed.

Yet still a further advantage of the present invention is that it provides an electrical generator that can works in extreme environments.

The embodiments of the electrical generator described herein are exemplary and numerous modifications, combinations, variations, and rearrangements can be readily envisioned to achieve an equivalent result, all of which are intended to be embraced within the scope of the appended claims. Further, nothing in the above-provided discussions of the electrical generator should be construed as limiting the invention to an embodiment or a combination of embodiments. The scope of the invention is defined by the drawings, the written description, and the appended claims.

What is claimed is:

1. An electrical generator that generates electricity from a wasted heat source that is generated by an external heat source, the electrical generator comprises:
    a housing that has an inlet channel and an outlet channel, the housing has a positive terminal at a first position of the housing and a negative terminal at a last position of the housing, the inlet channel is configured to be connected to an external fluid source that allows a fluid to enter inside the housing and the outlet channel of the housing is configured to allow the fluid to exit the housing;
    a plurality of plates, the plurality of plates has an A plate, at least one B plate and at least one C plate, wherein each individual plate will be referred as an A plate, a B(1) plate, a C(1) plate, a B(2) plate, a C(2) plate to a B(n) plate, and a C(n) plate and the plurality of plates are stacked as a column thereby forming a cartridge, the cartridge is housed within the housing, the A plate is the first plate of a cartridge and the C(n) plate is the last plate of the cartridge, the plurality of plates are stacked so that below the A plate there is always a B plate and below the B plate there is always a C plate and below the C plate there is another B plate and below the B plate there is another C plate until reaching a last C(n) plate; the plurality of plates are compressed together to form a bond that will be impermeable to any liquid, wherein the A plate is made of a thermo-electrical conductive material, and each B plate is made of a electrical insulator material, and each C plates is also made of a thermo-electrical conductive material, yet the C plates thermo-electric conductive material is different from the thermo-electric conductive material of the A plate, a first B plates first isolates the A plate from the C(1) plate and then the B plates separate the remaining C plates from each other until reaching the C(n) plate, the C(n) plate being a last plate of the cartridge, a difference of electro-chemical potential is found between the A plate and the C plates, the difference is an Output Voltage of the electrical generator;
    a plurality of through holes are defined in the plurality of plates of the cartridge, the through holes are defined as an array of holes, the array of holes of the plurality of plates are aligned to form a plurality of linear channels that pass through the cartridge, the plurality of linear channels are configured to allow a fluid, from the wasted heat source to pass through the linear channels thereby allowing an electrical charge to pass from the A plate to the C plates and also between each C plates, the number of linear channels within the plurality of plates and the fluid temperature are factors that contributes directly and proportionally to a generated direct electrical current that is generated by the electrical generator; and
    the fluid is placed within the inlet channel of the housing, and the fluid is configured to flow toward the outlet channel of the housing thereby moving the electrical charge between the plates,
    the positive terminal is attached to the A plate and the negative terminal is attached to the C(n) plate, the positive and the negative terminals are configured to take a direct electrical current generated by the electrical generator out to an environment that uses or stores the direct electrical current.

2. The electrical generator that generates electricity from the wasted heat that is generated by the external heat source of claim 1, the A plate, the B plates and the C plates have a same geometric form, each geometric form has a same width, a same length, yet each plates height can vary:
    the A plate and the C plates are made of any thermo-electric conductive material that is either pure or doped, the A plates and the C plates can be made of either: a Li, a Rb, a K, a Ca, a Na, a Mg, a Al, a Mn, a Zn, a Cr, an Fe, a Ni, a Sn, a Pb, a Hg, a Cu, a Ag, a Pt, a C material, or of any other thermo-electric conductive variants that can be either of a carbon fiber, a Graphite, a Graphene and Carbon material; and B plates can be made of any non electric conductive material, that is either a pure or a doped material;
    the B plates can be made of either a Silicone, a Teflon, a Ceramic, a Glass and some Epoxy material; and
    the fluid can be of any liquid that has thermo-conductive capabilities able to carry ions.

3. The electric generator that generates electricity from the wasted heat that is generated by the external heat source of claim 2, wherein a plurality of electric conductive bridges bridge the C plates of the cartridge.

4. The electric generator that generates electricity from the wasted heat that is generated by the external heat source of claim 3, the electric generator comprises of a plurality of cartridges, the plurality of cartridges is formed by stacking each cartridge on top of each other, the stacking of the cartridges are configured to increases the power output of the electrical generator.

5. The electric generator that generates electricity from the wasted heat that is generated by the external heat source of claim 4, the electric generator comprises a pair of magnets, each magnet has a different polarity, a first magnet of the pair of magnets is placed inside the inlet channel before a first Separator of the electrical generator and a second magnet is placed inside the outlet channel after a second Separator of the electrical generator, the pair of magnets are configured to create a magnetic field, the magnetic field
    produces a Magneto-hydro-dynamic effect (MHD) on the fluid, that effect is used to control the amount of electricity that the electrical generator will generate.

6. The electric generator that generates electricity from the wasted heat that is generated by the external heat source of claim 1, wherein a plurality of electric conductive bridges bridge the C plates of the cartridge.

7. The electric generator that generates electricity from the wasted heat that is generated by the external heat source of claim 6, the electric generator comprises of a plurality of cartridges, the plurality of cartridges is formed by stacking each cartridge on top of each other, the stacking of the cartridges are configured to increases the power output of the electrical generator.

8. The electric generator that generates electricity from the wasted heat that is generated by the external heat source of claim 7, the electric generator comprises a pair of magnets, each magnet has a different polarity, a first magnet of the pair of magnets is placed inside the inlet channel before a first Separator of the electrical generator and a second magnet is placed inside the outlet channel after a second Separator of the electrical generator, the pair of magnets are configured to create a magnetic field, the magnetic field
    produces a Magneto-hydro-dynamic effect (MHD) on the fluid, that effect is used to control the amount of electricity that the electrical generator will generate.

9. The electric generator that generates electricity from the wasted heat that is generated by the external heat source of claim 7, wherein the A plate is made of a graphite, the B plates are made of a silicone, and the C plates are made of aluminum, the fluid is a distilled water, the fluid temperature is between the range of at least 73 degree Fahrenheit to at most 158 degree Fahrenheit.

10. The electric generator that generates electricity from the wasted heat that is generated by the external heat source of claim 9, wherein the fluid is doped with a plurality of magnesium ions.

11. The electric generator that generates electricity from the wasted heat that is generated by the external heat source of claim 10, wherein each plate of the plurality of plates has the following dimensions: width=four inches, length=four inches, and height=one thirty-second of an inch, and a hexagonal array of 604 holes that measure one eighth of an inch in diameter.

12. The electric generator that generates electricity from the wasted heat that is generated by the external heat source of claim 9, wherein each plate of the plurality of plates has the following dimensions: width=four inches, length=four inches, and height=one thirty-second of an inch, and a hexagonal array of 604 holes that measure one eighth of an inch in diameter.

13. The electric generator that generates electricity from the wasted heat that is generated by the external heat source of claim 7, wherein the A plate is made of a graphite, the B plates are made of a silicone, and the C plates are made of aluminum, the fluid is a drinking water, the fluid temperature is between the range of at least 73 degree Fahrenheit to at most 158 degree Fahrenheit.

14. The electric generator that generates electricity from the wasted heat that is generated by the external heat source of claim 13, wherein the fluid is doped with magnesium ions.

15. The electric generator that generates electricity from the wasted heat that is generated by the external heat source of claim 14, wherein each plate of the plurality of plates has the following dimensions: width=four inches, length=four inches, and height=one thirty-second of an inch, and a hexagonal array of 604 holes that measure one eighth of an inch in diameter.

16. An electrical generator that generates electricity from a wasted heat source that is generated by an external heat source, the electrical generator comprises:
a housing that has an inlet channel and an outlet channel, the housing has a positive terminal at a first position of the housing and a negative terminal at a last position of the housing, the inlet and the outlet of the housing are configured to be connected to the external fluid source so that a re-circulating system is formed;
a plurality of plates, the plurality of plates has an A plate, at least one B plate and at least one C plate, wherein each individual plate will be referred as an A plate, a B(1) plate, a C(1) plate, a B(2) plate, a C(2) plate to a B(n) plate, and a C(n) plate and the plurality of plates are stacked as a column thereby forming a cartridge, the cartridge is housed within the housing, the A plate is the first plate of a cartridge and the C(n) plate is the last plate of the cartridge, the plurality of plates are stacked so that below the A plate there is always a B plate and below the B plate there is always a C plate and below the C plate there is another B plate and below the B plate there is another C plate until reaching a last C(n) plate; the plurality of plates are compressed together to form a bond that will be impermeable to any liquid, wherein the A plate is made of a thermo-electrical conductive material, and each B plate is made of a electrical insulator material, and each C plates is also made of a thermo-electrical conductive material, yet the C plates thermo-electric conductive material is different from the thermos-electric conductive material of the A plate, a first B plates first isolates the A plate from the C(1) plate and then the B plates separate the remaining C plates from each other until reaching the C(n) plate, the C(n) plate being a last plate of the cartridge, a difference of electro-chemical potential is found between the A plate and the C plates, the difference is an Output Voltage of the electrical generator;
a plurality of through holes are defined in the plurality of plates of the cartridge, the through holes are defined as an array of holes, the array of holes of the plurality of plates are aligned to form a plurality of linear channels that pass through the cartridge, the plurality of linear channels are configured to allow a fluid, from the wasted heat source to pass through the linear channels thereby allowing an electrical charge to pass from the A plate to the C plates and also between each C plates, the number of linear channels within the plurality of plates and the fluid temperature are factors that contributes directly and proportionally to a generated direct electrical current that is generated by the electrical generator; and
the fluid is placed within the inlet channel of the housing, and the fluid is configured to flow toward the outlet channel of the housing thereby moving the electrical charge between the plates,
the positive terminal is attached to the A plate and the negative terminal is attached to the C(n) plate, the positive and the negative terminals are configured to take a direct electrical current generated by the electrical generator out to an environment that uses or stores the direct electrical current.

17. The electrical generator that generates electricity from the wasted heat that is generated by the external heat source of claim 16, the A plate, the B plates and the C plates have a same geometric form, each geometric form has a same width, a same length, yet each plates height can vary:
the A plate and the C plates are made of any thermo-electric conductive material that is either pure or doped, the A plates and the C plates can be made of either: a Li, a Rb, a K, a Ca, a Na, a Mg, a Al, a Mn, a Zn, a Cr, an Fe, a Ni, a Sn, a Pb, a Hg, a Cu, a Ag, a Pt, a C material, or of any other thermo-electric conductive variants that can be either of a carbon fiber, a Graphite, a Graphene and Carbon material; and B plates can be made of any non electric conductive material, that is either a pure or a doped material;
the B plates can be made of either a Silicone, a Teflon, a Ceramic, a Glass and some Epoxy material; and
the fluid can be of any liquid that has thermo-conductive capabilities able to carry ions.

18. The electric generator that generates electricity from the wasted heat that is generated by the external heat source of claim 17, wherein a plurality of electric conductive bridges bridge the C plates of the cartridge.

19. The electric generator that generates electricity from the wasted heat that is generated by the external heat source of claim 18, the electric generator comprises of a plurality of cartridges, the plurality of cartridges is formed by stacking each cartridge on top of each other, the stacking of the cartridges are configured to increases the power output of the electrical generator.

20. The electric generator that generates electricity from the wasted heat that is generated by the external heat source of claim 19, the electric generator comprises a pair of magnets, each magnet has a different polarity, a first magnet of the pair of magnets is placed inside the inlet channel before a first Separator of the electrical generator and a second magnet is placed inside the outlet channel after a second Separator of the electrical generator, the pair of magnets are configured to create a magnetic field, the magnetic field
   produces a Magneto-hydro-dynamic effect (MHD) on the fluid, that effect is used to control the amount of electricity that the electrical generator will generate.

\* \* \* \* \*